(12) United States Patent
Lee et al.

(10) Patent No.: US 11,773,808 B2
(45) Date of Patent: Oct. 3, 2023

(54) THRUST PANEL

(71) Applicant: POSTECH Research and Business Development Foundation, Pohang-si (KR)

(72) Inventors: Jeongrak Lee, Daegu (KR); Anna Lee, Pohang-si (KR); Eunji Lee, Daegu (KR); Youngbin Son, Pohang-si (KR); Hanseong Jo, Goyang-si (KR); Seonghyeon Kim, Busan (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 0 days.

(21) Appl. No.: 17/705,489

(22) Filed: Mar. 28, 2022

(65) Prior Publication Data

US 2023/0235716 A1    Jul. 27, 2023

(30) Foreign Application Priority Data

Jan. 27, 2022   (KR) .................. 10-2022-0012149

(51) Int. Cl.
   *F02K 9/94*    (2006.01)
   *H02S 10/40*   (2014.01)
   *F02K 9/36*    (2006.01)

(52) U.S. Cl.
   CPC .............. *F02K 9/94* (2013.01); *F02K 9/36* (2013.01); *H02S 10/40* (2014.12)

(58) Field of Classification Search
   CPC ..... F02K 9/08; F02K 9/28; F02K 9/32; F02K 9/36; F02K 9/94; F02K 9/95; F02K 9/42; F02K 9/72; B64G 1/403; B64G 1/404; F42B 10/661
   See application file for complete search history.

(56) References Cited

U.S. PATENT DOCUMENTS

| | | | |
|---|---|---|---|
| 6,579,636 B2* | 6/2003 | Oguri | C04B 41/89 428/408 |
| 7,958,823 B2* | 6/2011 | Sawka | F02K 9/95 102/202 |
| 9,790,895 B2* | 10/2017 | Nelson | F02K 9/30 |
| 2010/0218481 A1* | 9/2010 | Mihara | F02K 9/12 60/247 |
| 2017/0259946 A1* | 9/2017 | White, Jr. | B64G 1/403 |
| 2017/0283095 A1* | 10/2017 | Koehler | B33Y 70/00 |

* cited by examiner

*Primary Examiner* — Loren C Edwards
(74) *Attorney, Agent, or Firm* — LEX IP MEISTER, PLLC (57) ABSTRACT

A thrust panel may include a propellant socket formed to accommodate a plurality of propellants and a combustion chamber that communicates with the propellant socket.

10 Claims, 7 Drawing Sheets

THRUST PANEL

CROSS-REFERENCE TO RELATED APPLICATION

This application claims priority to and the benefit of Korean Patent Application No. 2022-00127149, filed on Jan. 27, 2022, the disclosure of which is incorporated herein by reference in its entirety.

BACKGROUND

1. Field of the Invention

The present invention relates to thrust panel, solar panel module and propellant ignition method through which a plurality of propellants may share a combustion chamber.

2. Discussion of Related Art

Spacecrafts such as artificial satellites, space stations, space telescopes, and space telescopes orbiting the Earth, and space exploration satellites orbiting around other celestial bodies include a thrust device for maintaining and controlling the position on orbit, making movement during the docking process and setting the direction of the propulsion. Thrust refers to the propulsion force as a reaction force against the propellant pushing the surrounding fluid or by burning fuel.

Spacecraft use rocket engines because there is no fluid or little fluid around them. A rocket, a propulsion engine that propels forward using purely burning fuel even in the absence of air and blowing out high-pressure gas, obtains the power they need to fly by sending the combustion gases, generated by the combustion action of fuel and oxidizer, out of the engine's nozzle. When gas is sent out, the rocket gains propulsion by the amount of momentum the gas has according to the action-reaction law or the law of conservation of momentum.

The rocket propulsion engine is largely divided into a solid propulsion engine and a liquid propulsion engine according to the type of propellant. Solid-propelled rocket has a mixture of oxidizing agent and fuel as a single compound charged in solid form inside the rocket propulsion engine. Because there is a solid propellant mixed with fuel and oxidizer inside the fuel tank, when it is ignited the gas generated by combustion of this propellant is ejected through an ejector.

Liquid-propelled rocket has fuel and oxidant in tanks respectively. Kerosene is widely used as a fuel, and liquid oxygen is used as an oxidizing agent. The liquid propulsion engine injects fuel and oxidizer into the combustion chamber of the rocket just as fuel and oxygen are supplied to an automobile engine. The liquid propulsion engine causes the combustion in the combustion chamber and ejects the combustion gas through the ejector.

Recently, a micro-satellite called CubeSat or cube-satellite is being developed. Current standard for cube-satellite is within 10 cm in width, length, and height, and within 1 L in volume and called as a 'UNIT'. If it is configured with one unit, it is called 1 U CubeSat, and if there are two units, it is called 2 U CubeSat. Unlike general satellites, since CubeSat is small, durable and has simple design, the payloads inside are unbreakable and durable. Also, since there is a fixed standard, multiple units can be fired using the same projectile. This means that the cost is low and mass production is possible, and although it cannot perform various and huge missions like general satellites, it has the advantage of launching several or dozens of satellites and cover wide range all at the same time.

Since several cube-satellites fly in formation, a thrust engine for controlling attitude and keeping space is essential. However, since the thruster mounted on a spacecraft is large and heavy, it is difficult to apply it to a cube-satellite. In particular, the liquid propulsion engine is difficult to apply because a separate fuel tank is required.

SUMMARY OF THE INVENTION

The present disclosure is directed to providing a thrust panel may be packaged to various parts including solar panel, cube-satellite, sounding rocket, etc and may generate thrust while minimizing separate space and mass budget.

The present disclosure is directed to maximizing a packaging rate and to generate thrust profiles of various modes.

Additional aspects of the disclosure will be set forth in part in the description which follows and, in part, will be obvious from the description, or may be learned by practice of the disclosure.

In accordance with an embodiment of the present disclosure, a thrust panel may include a propellant socket formed to accommodate a plurality of propellants and a combustion chamber that communicates with the propellant socket.

The combustion chamber may be formed as a single space.

The propellant socket may be divided into a plurality of spaces, and the plurality of propellants may be accommodated in the plurality of spaces respectively.

The thrust panel may further include a separation layer disposed between the propellant socket and the combustion chamber.

The thrust panel may further include an ignition element accommodated in the propellant socket together with the plurality of propellants, and the separation layer may be configured that a part of the separation layer is destroyed when at least one of the plurality of propellants is ignited by the ignition element.

When at least one of the plurality of propellants is ignited by the ignition element, only a part of the separation layer corresponding to the ignited propellants of the plurality of propellants is destroyed, so that the combustion gas generated by the ignited propellants of the plurality of propellants is introduced into the combustion chamber. A portion of the separation layer that is not destroyed may be maintained to cover the propellant that is not ignited among the plurality of propellants.

Each of the plurality of propellants may be a solid propellant or a gel propellant.

In accordance with an embodiment of the present disclosure, a solar panel module may include the thrust panel, a heat-resistant coating layer disposed above the combustion chamber, and a solar panel disposed above the heat-resistant coating layer.

The solar panel module may further include a nozzle layer disposed above the solar panel, and each of the heat-resistant coating layer and the solar panel may have a penetration part communicating with the nozzle layer and the combustion chamber.

The nozzle layer may include a single nozzle.

In accordance with an embodiment of the present disclosure, a method to ignite propellants in a thrust panel may include providing a thrust panel with a propellant socket accommodating a plurality of propellants and a combustion chamber communicating with the propellant socket; and igniting at least one of the plurality of propellants.

The method for igniting propellants may further include igniting at least one other propellant that has not ignited among the plurality of propellants after igniting at least one of the plurality of propellants.

The amount of propellant ignited in igniting at least one of the plurality of propellants may be different from the amount of the propellant ignited in igniting at least one other propellant that has not ignited among the plurality of propellants.

The method to ignite propellants may provide at least one of the following modes: a basic mode in which the plurality of propellants are ignited at regular intervals by same amounts, a power mode igniting the plurality of propellants at regular intervals and including simultaneously igniting the plurality of propellants, and a continuous mode in which the plurality of propellants are continuously ignited.

In accordance with an embodiment of the present disclosure, a thrust panel may include a propellant socket configured to accommodate a plurality of propellants. A combustion chamber may be formed in the propellants socket. The combustion gas generated by the ignited propellant may be introduced into the combustion chamber through the side surface thereof when at least one of the plurality of propellants is ignited.

The thrust panel may further include an ignition element igniting the plurality of propellants and a separator separating the combustion chamber and the plurality of propellants. The ignition element may be located at side surface of the plurality of propellants. The separator may be configured to be partially destroyed, when at least one of the plurality of propellants is ignited by the ignition element.

At least a part of the upper part of the combustion chamber may be opened so that the gas introduced through the side surface of the combustion chamber is emitted through the upper part of the combustion chamber.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Reference will now be made in detail to the embodiments of the present disclosure, examples of which are illustrated in the accompanying drawings, wherein like reference numerals refer to like elements throughout. The present disclosure may, however, be embodied in many different forms and should not be construed as being limited to the embodiments set forth herein. The shapes and sizes of elements in the drawings may be exaggerated for a clear description.

The terms used in the present specification are merely used to describe particular embodiments, and not intended to limit the present disclosure. An expression used in the singular encompasses the expression of the plural, unless the context clearly indicates otherwise. Throughout the specification, it is to be understood that the terms such as "include" or "have etc., are intended to indicate the existence of the features, numbers, operations, components, parts, or combinations thereof disclosed in the specification, are not intended to preclude the possibility that one or more other features, numbers, operations, components, parts, or combinations thereof may exist or may be added.

It will be understood that, although the terms "first", "second", etc., may be used herein to describe various elements, these elements should not be limited by these terms. The above terms are used only to distinguish one component from another. For example, a first component discussed below could be termed a second component, and similarly, the second component may be termed the first component without departing from the teachings of this disclosure. As used herein, the term "and/or" includes any and all combinations of one or more of the associated listed items.

Hereinafter, exemplary embodiments of the present invention will be described below with reference to the drawings.

Figure 1:
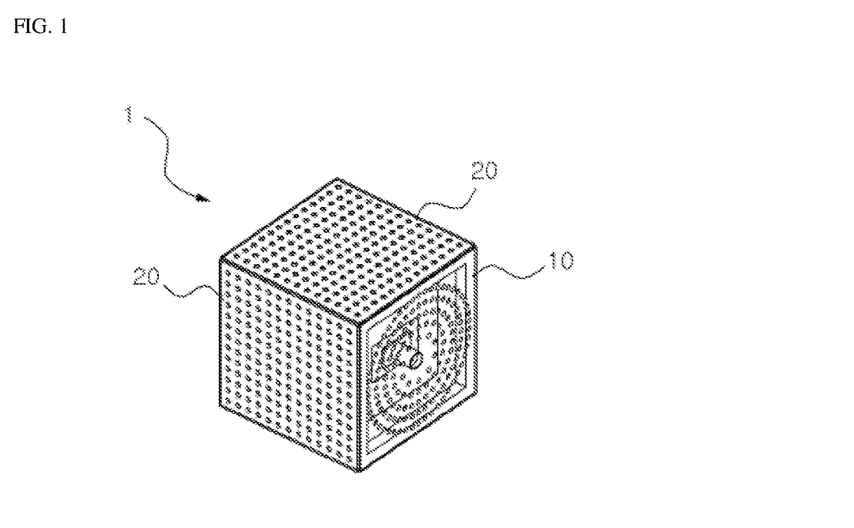
FIG. 1 is a perspective view of spacecraft according to an exemplary embodiment of the present invention.
Figure 2:
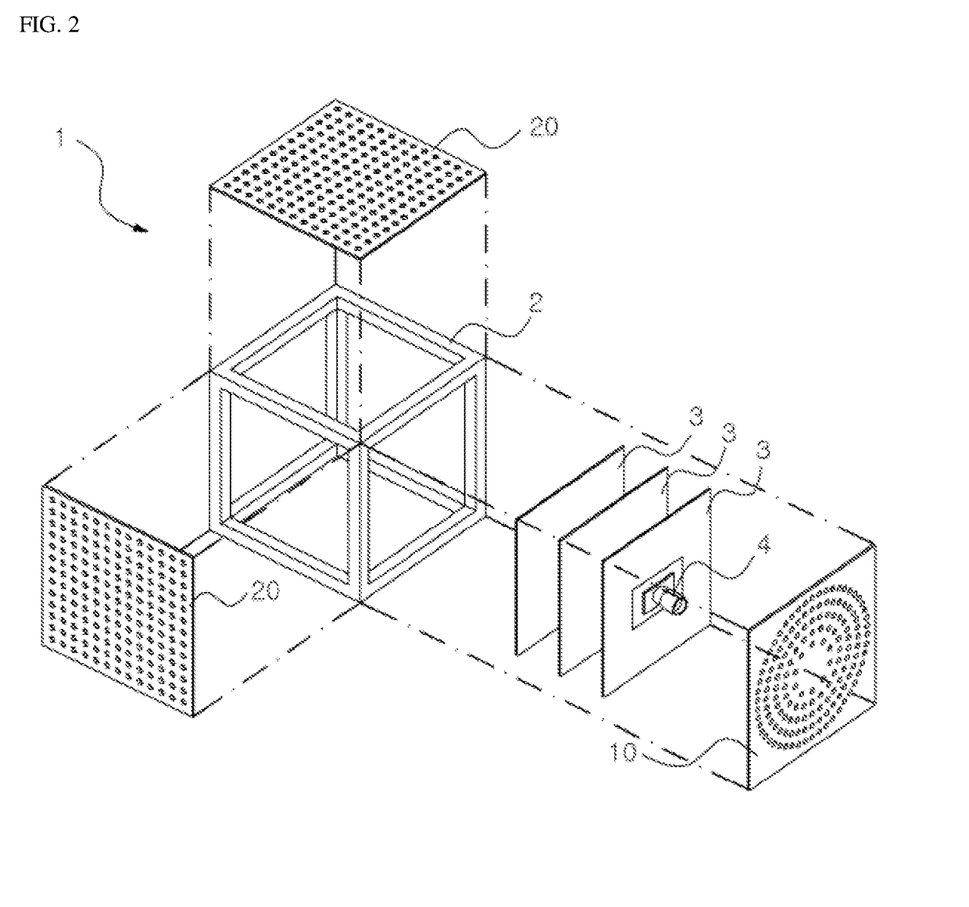
FIG. 2 is an exploded perspective view of the spacecraft in FIG. 1.

FIG. 1 is a perspective view showing a spacecraft according to an embodiment of the present invention and FIG. 2 is an exploded perspective view of the spacecraft in FIG. 1.

Referring to FIG. 1 and FIG. 2, the spacecraft 1 according to the embodiment of the present invention may be a cube-satellite including a small thruster. The spacecraft 1 may include a frame 2 and a payload 3 accommodated inside the frame 2. Depending on the purpose of the spacecraft 1, the payload 3 may include observation equipment, measurement equipment, communication equipment etc. In particular, the payload 3 may include a camera 4, a sensor, a radar, a communication repeater, an antenna, etc.

The spacecraft 1 may include a solar panel module 20 forming an outer wall of the frame 2 or a thrust panel 10 forming an outer wall of the frame 2. The spacecraft 1 may require a solar cell and a battery to supply power to the payload 3. In addition, the spacecraft 1 may require an attitude control device that directs the attitude and the orbit to the desired direction and stabilizes the attitude by maintaining the position.

The solar panel module 20 according to the embodiment of the present invention may perform both a power supply function and an attitude control function. The thrust panel 10 according to an embodiment of the present invention may perform an attitude control function while forming the outer wall of the frame 2.

Figure 3:
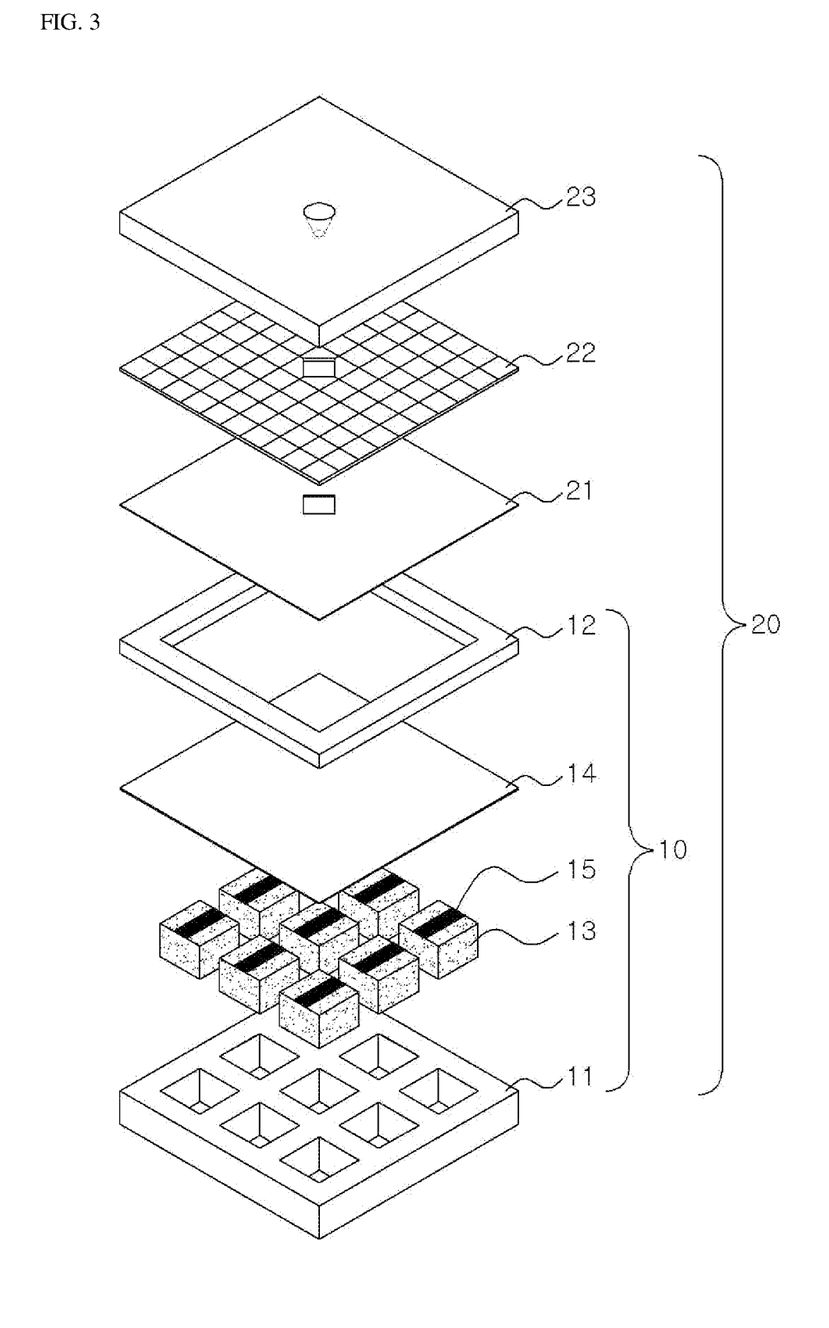
FIG. 3 is an exploded perspective view of thrust panel and solar panel module according to an exemplary embodiment of the present invention.
Figure 4:
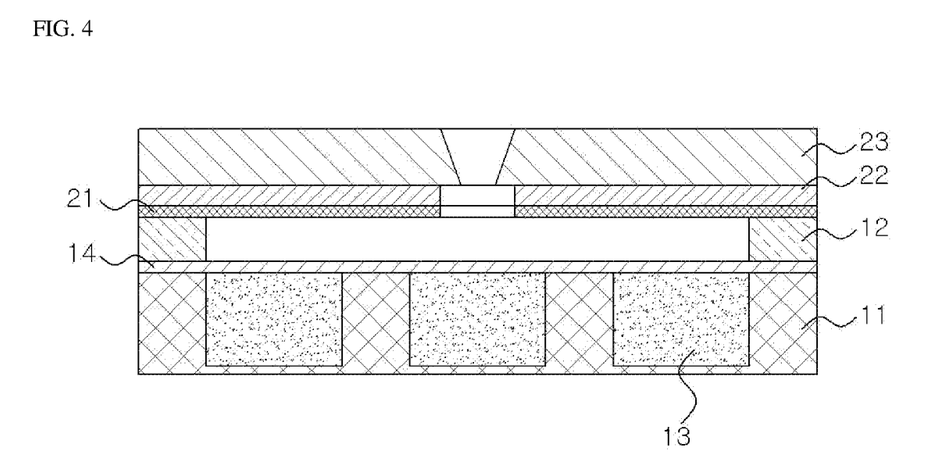
FIG. 4 is a cross-sectional view of a thrust panel and a solar panel module according to an embodiment.

FIG. 3 is an exploded perspective view of a thrust panel and a solar panel module according to an embodiment of the present invention, and FIG. 4 is an embodiment of the present invention, and FIG. 4 is a cross-sectional view of a thrust panel and a solar panel module according to an embodiment of the present invention.

Referring to FIGS. 3 and 4, the thrust panel 10 may include a propellant socket 11 and a combustion chamber 12.

The propellant socket 11 may be formed to accommodate a plurality of propellants 13. For example, the propellant socket 11 may be divided into a plurality of spaces, and a plurality of propellants 13 may be accommodated in the plurality of propellant socket 11, respectively. Meanwhile, a printed circuit board (not shown) may be provided on one side of the propellant socket 11.

A plurality of spaces may be arranged in a grid shape. The shape and size of each space may not be limited. For example, each space may include a square or a circular shape. Each space and size may be the same, but each space and size may also be different.

The propellant 13 for propulsion of the rocket may be a solid propellant or a gel propellant. For example, the propellant 13 may be mixed in a gel form and inserted into and cured in the space of propellant socket 11, and may be disposed in the space of the propellent socket 11. Accordingly, each propellant 13 may have a shape corresponding to each space of the propellant socket 11.

An ignition element 15 for ignition of the propellant 13 may be provided in each space of the propellant socket 11. The ignition element 15 may be disposed to cover at least a portion of the propellant 13. The ignition element 15 may be coupled to and integrated with the propellant 13 by applying a gel or semi-solid element 15 to the propellant 13 and solidifying it.

The thrust panel 10 may include an ignition device (not shown). The ignition device may individually ignite the ignition elements 15 in each space of the propellant socket 11, thereby individually igniting each propellant 13. For example, the ignition device may include an ignition circuit and an electrode, and the electrode may be coupled to the ignition element 15.

The combustion chamber 12 may be communicated with the propellant socket 11. Accordingly, the combustion gas generated by ignition of the propellant 13 may be introduced into the combustion chamber. The combustion chamber 12 may be formed as a single space. In this case, a plurality of propellants 13 may share the combustion chamber 12 in a single space.

A separation layer 14 may be disposed between the combustion chamber 12 and the propellant socket 11. The separation layer 14 may include a special coating called separation coating.

The separation layer 14 may be configured such that a portion of the separation layer 14 is destroyed when the propellant 13 is ignited. Specifically, the separation layer 14 may be configured such that a portion corresponding to the ignited propellant 13 is destroyed when one of a plurality of propellants 13 is ignited. Accordingly, the combustion gas generated due to the ignition of the propellant 13 may be introduced into the combustion chamber 12.

However, even in this case, the remaining parts of the separation layer 14 that have not been destroyed may cover the propellant 13 that has not been ignited. Accordingly, heat and pressure generated by the ignited propellant 13 may be prevented from unintentionally igniting the unignited propellant 13.

The solar panel module 20 may include a thrust panel 10, a heat-resistant coating layer 21, and a solar panel 22.

The heat-resistant coating layer 21 may be disposed above the combustion chamber 12, and the solar panel 22 may be disposed above the heat-resistant coating layer 21. In addition, a nozzle layer 23 may be disposed above the solar panel 22.

A penetration part may be formed on each of the heat-resistant coating layer 21 and the solar panel 22. Accordingly, the gas in the combustion chamber 12 may be introduced into the nozzle layer 23 through a penetration part formed in the heat-resistant coating layer 21 and the solar panel 22.

The nozzle layer 23 may include a single nozzle, and a gas in the combustion chamber 12 may be discharged to the outside through the single nozzle.

The thrust panel 10 or the solar panel module 20 may be coupled to the outside of the frame 2 of the spacecraft 1 to form an outer wall. The thrust panel 10 may be formed of a transparent material.

Therefore, even if the thrust panel 10 is packaged on the payload 3 such as a camera 4 or communication equipment accommodated in the frame 2, the function or performance of the payload 3 is not affected, and even if the solar panel module 22 is formed by being coupled to the solar panel 22, the power generation function or performance of the solar panel 22 may not be affected.

Figure 5:
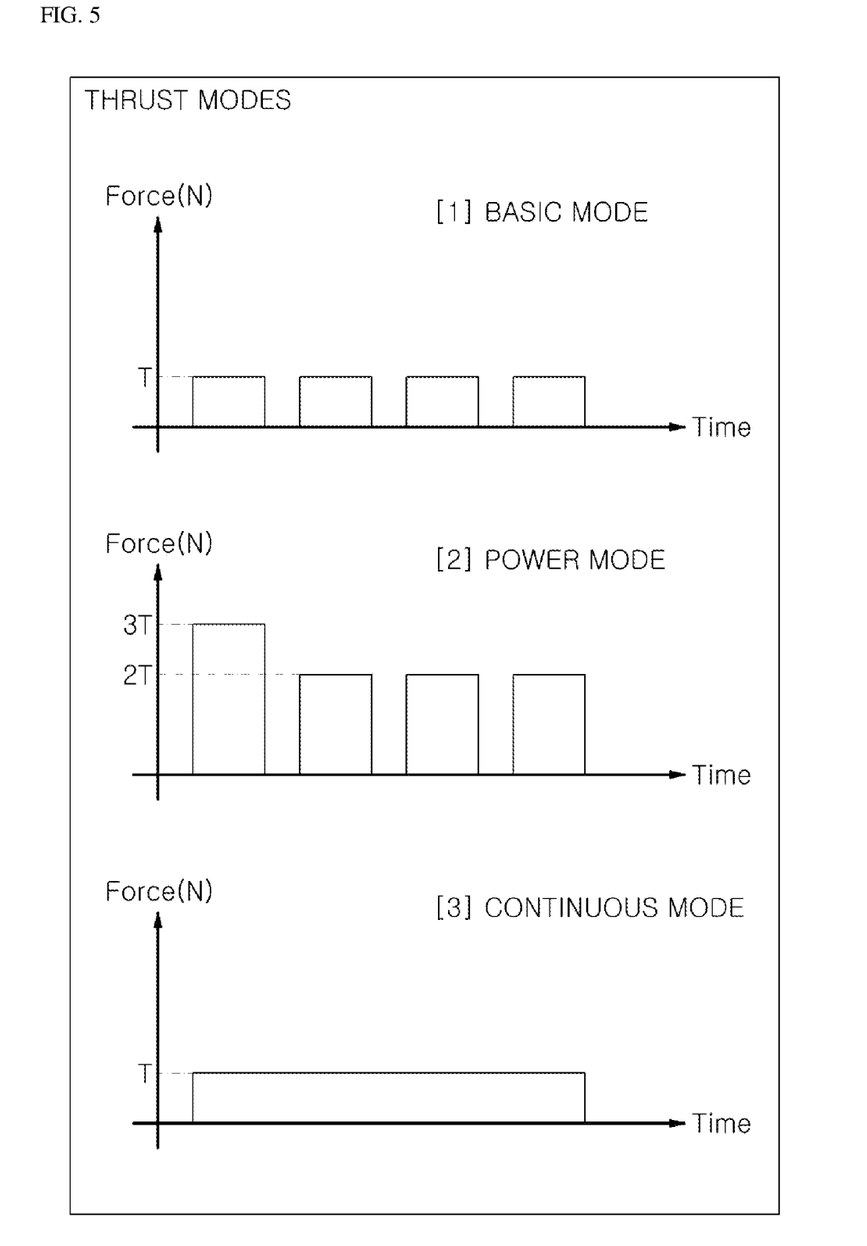
FIG. 5 is a view illustrating modes of a propellant ignition method according to an embodiment of the present invention.

FIG. 5 illustrates modes of a propellant ignition method according to an embodiment of the present invention.

Referring to FIG. 5, the propellant ignition method may include: providing a thrust panel with a propellant socket accommodating a plurality of propellants and a combustion chamber communicating with the propellant socket; and igniting at least one of the plurality of propellants. The method of igniting the propellant may further include igniting at least one other propellant that has not ignited among the plurality of propellants after igniting at least one of the plurality of propellants. Such a thrust panel may be the thrust panel 10 illustrated in FIGS. 1 through 4.

The amount of propellant ignited in igniting at least one propellant and the amount of propellant ignited in igniting at least one other propellant may be different or the same. These may be performed at regular intervals or continuously.

For example, the propellant ignition method may provide the following modes.

First, a basic mode for sequentially igniting a plurality of propellants by the same amount at regular intervals may be provided.

In addition, a power mode including igniting a plurality of propellants by the same amount at regular intervals, but simultaneously igniting a plurality of propellants may be provided. Such a power mode may be used when a thrust greater than thrust T generated when one propellant is ignited, for example, when a thrust of 2T, 3T or more is required. Alternatively, a plurality of propellants are provided to have different amounts, and in the power mode, it is also possible that a relatively large amount of propellants are ignited.

In addition, a continuous mode for continuously igniting a plurality of propellants may be provided.

The modes of the propellant ignition method described above are exemplary, and additionally, various modes that may be derived from the present invention may be provided.

According to the thrust panel, the solar panel module, and the propellant ignition method according to an embodiment of the present invention, the following effects may occur.

In the prior art, since only one propellant is used in one combustion chamber and one nozzle, the thrust panel may be propelled only once. Therefore, there is a limit to the moment that the thrust panel can generate, and the degree of freedom is low. In addition, since it is difficult to change the variation of grain configuration, the type of thrust profile that may occur also occurs as specified. In addition, in the prior art, since the propellant is located on the solar panel, when many solid propellants are inserted into the thrust panel to increase packaging efficiency and increase trajectory conversion capability (delta V), power generation efficiency of the solar panel is degraded by covering the solar panel.

On the other hand, in the present invention, since a plurality of propellants may share a single combustion chamber and selectively ignite a plurality of propellants, various modes of thrust profiles may be generated. Accordingly, one manufacturing process and one product may be applied to various sizes and types of satellites. In addition, since the thrust panel may generate a plurality of propulsion forces, the life of thrust panel may be extended. In addition, by integrating the flow path, packaging rate of thrust panel may be maximized.

Figure 6:
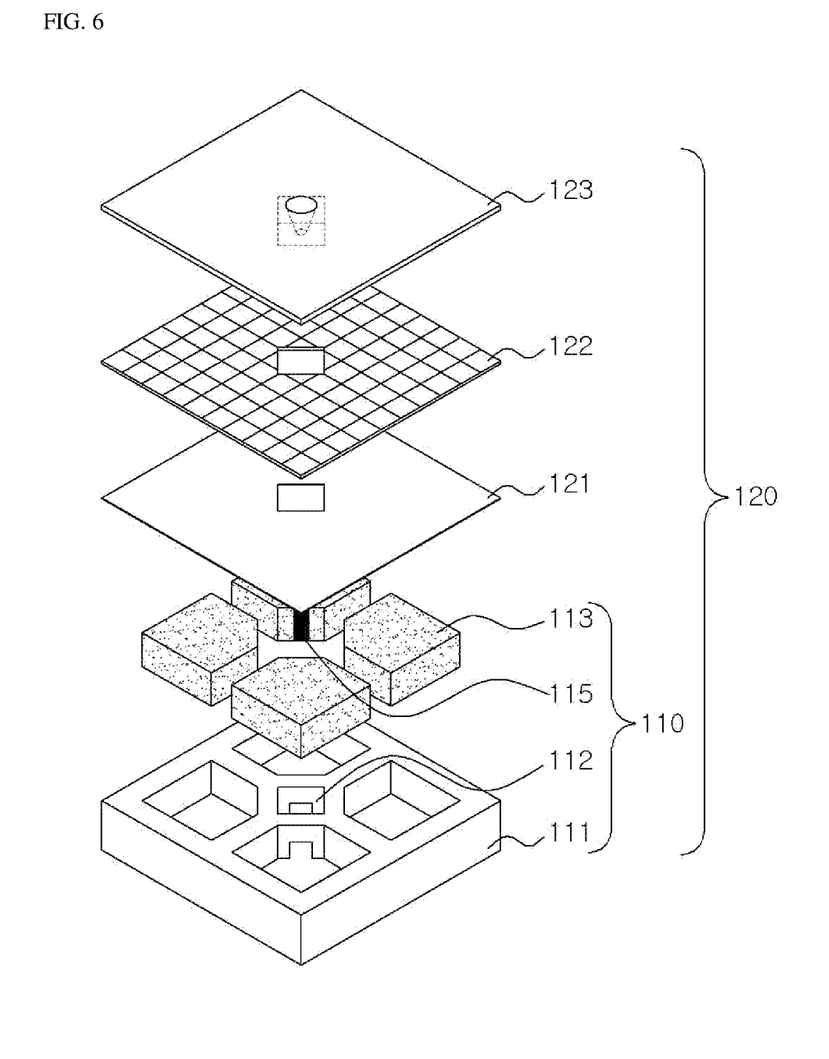
FIG. 6 is an exploded perspective view of a thrust panel according to another embodiment of the present invention.
Figure 7:
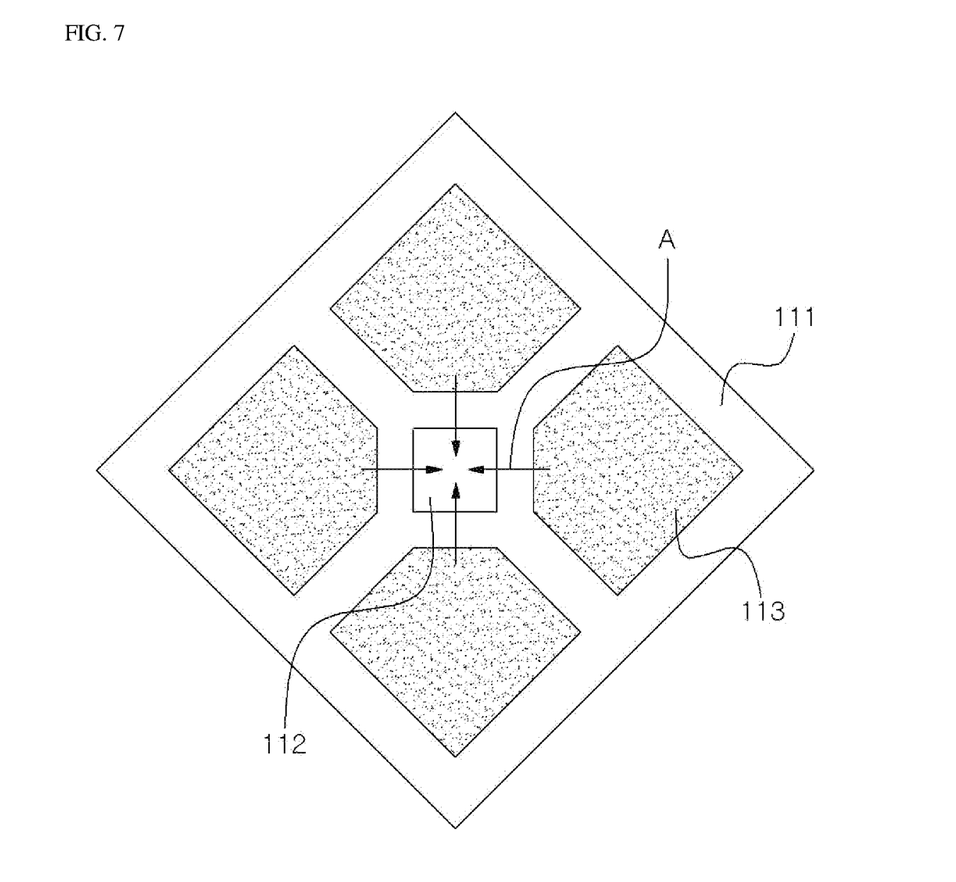
FIG. 7 is a horizontal cross-sectional view of a thrust panel according to another embodiment of the present invention viewed from the top.
Figure 8:
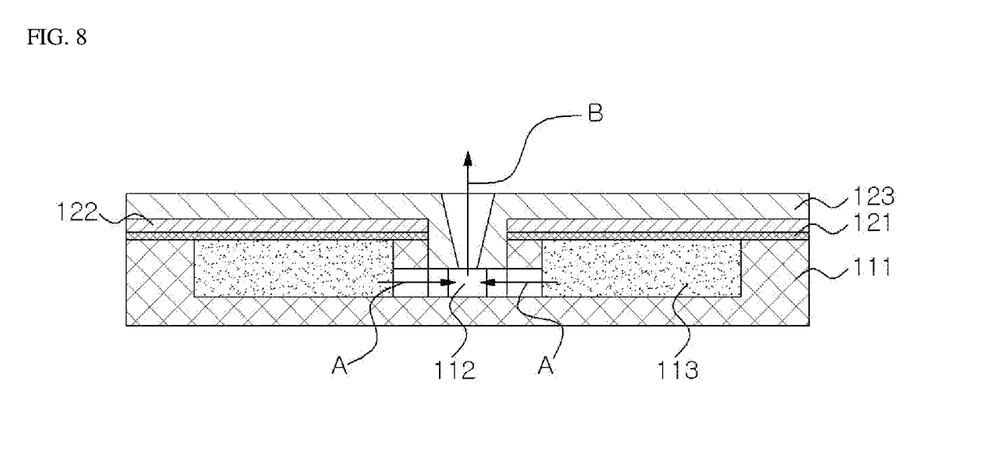
FIG. 8 is a vertical cross-sectional view of a thrust panel according to another embodiment of the present invention viewed from a side.

FIG. 6 is an exploded perspective view of a thrust panel according to another embodiment of the present invention, FIG. 7 is a horizontal cross-sectional view of the thrust panel according to another embodiment of the present invention, and FIG. 8 is a vertical cross-sectional view of the thrust panel according to another embodiment of the present invention.

Hereinafter, a thrust panel according to another embodiment will be described, focusing on a difference from a thrust panel according to an embodiment of the present invention. If not specifically mentioned, in the case of an element using the same name, the description of the thrust panel according to an embodiment may also be applied to the thrust panel according to another embodiment described below.

Referring to FIGS. 6, 7, and 8, the thrust panel 110 may include a propellant socket 111 formed to accommodate a plurality of propellants 113. In addition, the combustion chamber 112 may be formed in the propellant socket 111.

For example, the propellant socket 111 may be divided into a plurality of spaces, and a plurality of propellant 113 may be accommodated in a plurality of spaces of the propellant socket 111. In addition, the combustion chamber 112 may be formed at the center of the propellant socket 111 and next to a plurality of spaces.

Side surfaces of a plurality of spaces formed in the propellant socket 111 and side surfaces of the combustion chamber 112 may communicate with each other. Accordingly, when at least one of a plurality of propellants 113 is ignited, the combustion gas generated by the ignited propellant 113 may be introduced through the side surface of the combustion chamber 112.

In addition, at least a portion of the upper portion of the combustion chamber 112 may be opened. Accordingly, the combustion gas introduced through the side surface of the combustion chamber 112 may be ejected through the upper portion of the combustion chamber 112.

In this way, in the thrust panel 110 according to another embodiment, the combustion chamber 112 is disposed next to the propellant 113, and combustion gas generated due to ignition of the propellant 113 may be introduced through the side surface of the combustion chamber 112 and then ejected upward. The flow direction of the combustion gas is indicated by arrow A in FIGS. 7 and 8, and the ejection direction of the combustion gas is indicated by arrow B in FIG. 8.

The thrust panel 110 may include an ignition element 115, and the ignition element 115 may be located on a side surface of the propellant 113. In addition, a separator (not shown) may be provided to separate a plurality of propellants 113 and a combustion chamber 112.

The separator may close at least one of openings on each side surface communicating with the combustion chamber 112 and a plurality of spaces formed in the propellant socket 111. The separator may be configured such that one separator surrounds the entire side surface of the combustion chamber 112, or a plurality of separators may be configured to close each side opening. The separator provides a function similar to that of the separation layer of the thrust panel according to an embodiment, and may be configured to have similar characteristics.

The separator may be configured such that a part of the separator is destroyed when at least one of a plurality of propellants 113 is ignited by the ignition element 115. Accordingly, the combustion gas generated by the ignited propellant 113 flows into the combustion chamber 112, and the non-ignition propellant 113 may still be separated from the combustion chamber 112 by a separator. Due to this configuration, it is possible to prevent unintentional ignition of the unignited propellant 113 due to heat or pressure generated by the ignited propellant 113.

In addition, the solar panel module 120 according to another embodiment may include a thrust panel 110, a heat-resistant coating layer 121, a solar panel 122 and a nozzle layer 123.

In the thrust panel 110 and the solar panel module 120 according to another embodiment, since the combustion chamber 112 and the propellant 113 are disposed next to each other in parallel, the number of layers may be reduced, and thus the thickness thereof may be reduced.

The propellant ignition method according to an embodiment may also be applied to the thrust panel 110 and the solar panel module 120 according to another embodiment.

The present disclosure may provide a thrust panel may be packaged to various parts including solar panel, cube-satellite, sounding rocket, etc and may generate thrust while minimizing separate space and mass budget.

The present disclosure may maximize a packaging rate and generate thrust profiles of various modes.

Additional aspects of the disclosure will be set forth in part in the description which follows and, in part, will be obvious from the description, or may be learned by practice of the disclosure.

In the above, the configuration and features of the present invention have been described based on the embodiments of the present invention, but the present invention is not limited thereto, and various changes or modifications can be made within the spirit and scope of the present invention. It is apparent to those skilled in the art, and therefore, such changes or modifications are intended to fall within the scope of the appended claims.

What is claimed is:

1. A solar panel module comprising:
   a thrust panel, the thrust panel comprising:
      a propellant socket formed to accommodate a plurality of propellants; and
      a combustion chamber communicating with the propellant socket;
   a heat-resistant coating layer disposed above the combustion chamber of the thrust panel;
   a solar panel disposed above the heat-resistant coating layer; and
   a nozzle layer disposed above the solar panel,
   wherein the propellant socket is divided into a plurality of spaces,
   the plurality of propellants is accommodated in the plurality of spaces respectively, each of the plurality of propellants is separated from each other by walls of the plurality of spaces of the propellant socket, and a penetration part communicating the nozzle layer and the combustion chamber is formed on each of the heat-resistant coating layer and the solar panel.

2. The solar panel module according to claim 1, wherein the combustion chamber is formed as a single space.

3. The solar panel module according to claim 1, wherein the thrust panel further comprises a separation layer disposed between the propellant socket and the combustion chamber.

4. The solar panel module according to claim 3, wherein the thrust panel further comprises an ignition element accommodated in the propellant socket together with the plurality of propellants, wherein the separation layer is configured such that a part of the separation layer is destroyed when at least one of the plurality of propellants is ignited by the ignition element.

5. The solar panel module according to claim 4, wherein when at least one of the plurality of propellants is ignited by the ignition element, only a part of the separation layer corresponding to the ignited propellants of the plurality of propellants is destroyed, so that a combustion gas generated by the ignited propellants of the plurality of propellants is introduced into the combustion chamber and an undestroyed part of the separation layer is maintained to cover a plurality of unignited propellants of the plurality of propellants.

6. The solar panel module according to claim 1, wherein each of the plurality of propellants is a solid propellant or a gel propellant.

7. The solar panel module according to claim 1, wherein the nozzle layer includes a single nozzle.

8. A solar panel module including:

a thrust panel including a propellant socket configured to accommodate a plurality of propellants, wherein:

a combustion chamber is formed in the propellants socket; and a combustion gas generated by an ignited propellant is introduced into the combustion chamber through a side surface of the combustion chamber when at least one of the plurality of propellants is ignited;

a heat-resistant coating layer disposed above the combustion chamber of the thrust panel;

a solar panel disposed above the heat-resistant coating layer; and a nozzle layer disposed above the solar panel, wherein the propellant socket is divided into a plurality of spaces, the plurality of propellants is accommodated in the plurality of spaces respectively, each of the plurality of propellants is separated from each other by walls of the plurality of spaces of the propellant socket, and a penetration part communicating the nozzle layer and the combustion chamber is formed on each of the heat-resistant coating layer and the solar panel.

9. The solar panel module according to claim 8, wherein the thrust panel further includes:

an ignition element igniting the plurality of propellants; and a separator separating the combustion chamber and the plurality of propellants, wherein the ignition element is located at a side surface of the plurality of propellants, and wherein the separator is configured to be partially destroyed, when at least one of the plurality of propellants is ignited by the ignition element.

10. The solar panel module according to claim 8, wherein at least a part of an upper part of the combustion chamber is opened so that the combustion gas introduced through the side surface of the combustion chamber is emitted through the upper part of the combustion chamber.

* * * * *